United States Patent
Ulkuniemi et al.

(10) Patent No.: US 11,948,803 B2
(45) Date of Patent: Apr. 2, 2024

(54) METHODS FOR PASSIVATING SIDEWALLS OF SEMICONDUCTOR WAFERS AND SEMICONDUCTOR DEVICES INCORPORATING SEMICONDUCTOR WAFERS

(71) Applicant: Modulight Corporation, Tampere (FI)

(72) Inventors: Riina Ulkuniemi, Tampere (FI); Ville Vilokkinen, Tampere (FI); Petri Melanen, Tampere (FI)

(73) Assignee: Modulight Oy, Tampere (FI)

( * ) Notice: Subject to any disclaimer, the term of this patent is extended or adjusted under 35 U.S.C. 154(b) by 0 days.

(21) Appl. No.: 17/410,432

(22) Filed: Aug. 24, 2021

(65) Prior Publication Data
US 2023/0067724 A1 Mar. 2, 2023

(51) Int. Cl.
| | |
|---|---|
| *H01L 21/308* | (2006.01) |
| *H01L 21/027* | (2006.01) |
| *H01L 21/3065* | (2006.01) |
| *H01L 21/311* | (2006.01) |

(52) U.S. Cl.
CPC .......... *H01L 21/308* (2013.01); *H01L 21/027* (2013.01); *H01L 21/3065* (2013.01); *H01L 21/311* (2013.01)

(58) Field of Classification Search
CPC . H01L 21/308; H01L 21/027; H01L 21/3065; H01L 21/311
USPC .................................................. 438/694–714
See application file for complete search history.

(56) References Cited

U.S. PATENT DOCUMENTS

| | | | |
|---|---|---|---|
| 6,057,081 A | | 5/2000 | Yunogami et al. |
| 6,097,095 A | * | 8/2000 | Chung .............. H01L 21/76835 257/E21.507 |
| 9,412,841 B2 | * | 8/2016 | Teo .................... H01L 21/28518 |
| 10,050,033 B1 | * | 8/2018 | Thei ................ H01L 21/823462 |

(Continued)

FOREIGN PATENT DOCUMENTS

| | | | | |
|---|---|---|---|---|
| DE | 102017120886 A1 | * | 2/2019 | ......... H01L 21/0273 |
| EP | 3487016 A1 | | 5/2019 | |

(Continued)

OTHER PUBLICATIONS

Notification of Transmittal of the International Search Report and the Written Opinion of the International Searching Authority, or the Declaration, Application No. PCT.FI2022/050487, dated Oct. 7, 2022, 16 pages.

*Primary Examiner* — Duy Vu N Deo
(74) *Attorney, Agent, or Firm* — Ziegler IP Law Group

(57) ABSTRACT

A method for passivating sidewalls of patterned semiconductor wafer including ridge(s). The method includes: depositing first layer of first dielectric material on pattern surface of said wafer; etching portion of first layer to obtain tapered portions of first dielectric material along sidewall(s) of ridge(s); depositing second layer of second dielectric material on tapered portions and said wafer; depositing photo-sensitive material on second layer; aligning mask with photo-sensitive material, wherein portion(s) of photo-sensitive material corresponding to top surface of ridge(s) is/are unmasked, and remaining portion is masked; applying developing solution and exposing photo-sensitive material to remove portion(s) of photo-sensitive material; etching portion(s) of second layer that is/are deposited on top surface of ridge(s); and removing photo-sensitive material.

11 Claims, 5 Drawing Sheets

(56) References Cited

U.S. PATENT DOCUMENTS

| | | | |
|---|---|---|---|
| 2002/0166838 A1* | 11/2002 | Nagarajan | H01L 21/3086 |
| | | | 438/719 |
| 2009/0219966 A1 | 9/2009 | Tan et al. | |
| 2009/0294986 A1* | 12/2009 | Yan | H01L 21/76804 |
| | | | 438/618 |
| 2010/0046566 A1 | 2/2010 | Kudo | |
| 2015/0084108 A1* | 3/2015 | Saha | H01L 21/823814 |
| | | | 438/222 |

FOREIGN PATENT DOCUMENTS

| | | | | |
|---|---|---|---|---|
| JP | 2004014912 A | | 1/2004 | |
| TW | 201725753 A | * | 7/2017 | H01L 33/02 |

* cited by examiner

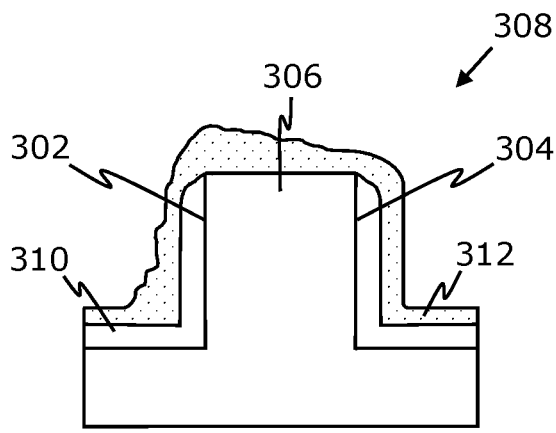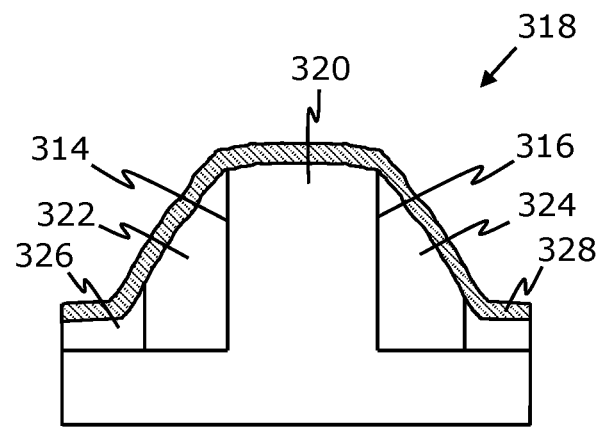
FIG. 3A
FIG. 3B
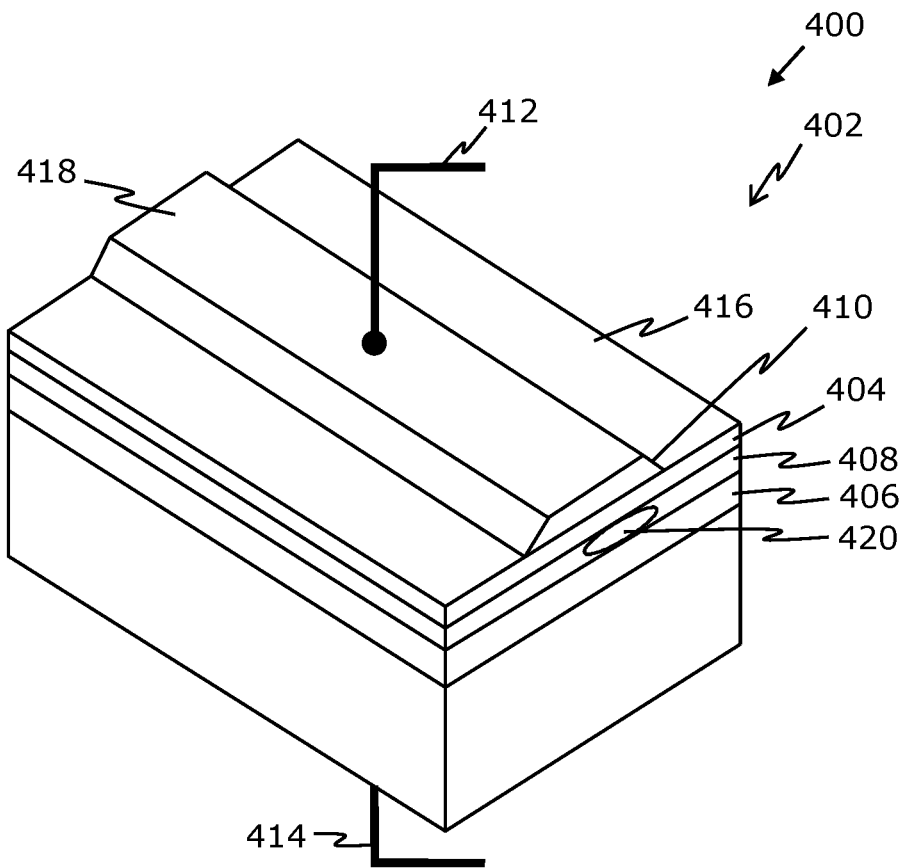
FIG. 4

METHODS FOR PASSIVATING SIDEWALLS OF SEMICONDUCTOR WAFERS AND SEMICONDUCTOR DEVICES INCORPORATING SEMICONDUCTOR WAFERS

TECHNICAL FIELD

The present disclosure relates to methods for passivating sidewalls of patterned semiconductor wafers comprising ridges. The present disclosure also relates to semiconductor devices comprising patterned semiconductor wafers.

BACKGROUND

Over the past few decades, semiconductor devices have witnessed significant developments. Typically, such semiconductor devices are made using semiconductor wafers that serve as substrates upon which microelectronic elements (such as microcircuits) are fabricated. Thus, these semiconductor wafers generally undergo several microfabrication processes such as doping, ion implantation, etching, thin-film deposition, photolithographic patterning, and the like. Some semiconductor wafers comprise ridges/mesas that are epitaxially formed over surfaces of said wafers. Sidewalls of these ridges/mesas are often susceptible to oxidation and/or contamination caused, for example, by ambient oxygen, chemical reagents, and the like. Therefore, various techniques are utilized for passivating (i.e. protecting) the sidewalls of the ridges/mesas of such semiconductor wafers from said oxidation and/or contamination.

However, existing techniques utilized for passivating sidewalls of ridges/mesas of a semiconductor wafer are associated with several limitations. Firstly, the existing techniques are not well-suited to efficiently insulate the sidewalls of the ridges/mesas (along with preventing the oxidation and/or contamination of the sidewalls). In other words, the sidewalls of the ridges/mesas are poorly insulated. Resultantly, considerable current leaks (or passes) through the sidewalls of the ridges/mesas when semiconductor devices using such a semiconductor wafer are in use, which adversely affects operational characteristics (such as resolution, accuracy, sensitivity, and the like) of the semiconductor devices. Moreover, in some cases, optical leakage also occurs in the semiconductor devices (such as, in semiconductor-based photodiodes) owing to the poor insulation of the sidewalls. This results in undesirable electrical characteristics (such as high dark currents) in the semiconductor devices and low fabrication yields of the semiconductor devices. Moreover, with the existing techniques, alignment requirements of a (photoresist) mask are extremely strict and tolerance for misalignment is very low.

Secondly, the existing techniques are inefficient in terms of providing effective and sufficient cooling of the semiconductor devices (such as in high-power semiconductor lasers), when said semiconductor devices are in operation. This is because the existing techniques have to make a trade-off between depositing a thick layer of a dielectric material ideal for suitably insulating the sidewalls and depositing a thin layer of the dielectric material ideal for properly conducting the heat away from the semiconductor devices (i.e. for a high rate of heat transfer). Therefore, when the thick layer of the dielectric material is deposited, cooling of the semiconductor devices by conduction of the heat away from the semiconductor devices is compromised, thereby adversely affecting operations of the semiconductor devices.

Thirdly, some existing techniques passivate the sidewalls of the ridges/mesas by improperly depositing the dielectric material over the sidewalls of the ridges/mesas. In such a case, sharp edges and/or non-uniform edges of the dielectric material are formed near the ridges/mesas. This complicates metallization near the ridges/mesas. For example, benzocyclobutene (BCB)-based passivation technique is often associated with issues like non-uniformity during the metallization, difficulty in sufficiently removing the BCB, undesirable micro-trenching, or similar.

Therefore, in light of the foregoing discussion, there exists a need to overcome the aforementioned drawbacks associated with existing techniques for passivating sidewalls of ridges/mesas of a semiconductor wafer.

SUMMARY

The present disclosure seeks to provide a method for passivating sidewalls of a patterned semiconductor wafer comprising at least one ridge. The present disclosure also seeks to provide a semiconductor device comprising at least one patterned semiconductor wafer. An aim of the present disclosure is to provide a solution that overcomes at least partially the problems encountered in prior art.

In one aspect, an embodiment of the present disclosure provides a method for passivating sidewalls of a patterned semiconductor wafer comprising at least one ridge, the method comprising:
- depositing a first layer of a first dielectric material on a pattern surface of the patterned semiconductor wafer;
- etching a portion of the first layer to obtain tapered portions of the first dielectric material along at least one sidewall of the at least one ridge;
- depositing a second layer of a second dielectric material on the tapered portions and the patterned semiconductor wafer;
- depositing a photo-sensitive material on the second layer;
- aligning a mask with the photo-sensitive material, wherein at least one portion of the photo-sensitive material corresponding to a top surface of the at least one ridge is unmasked, and a remaining portion of the photo-sensitive material is masked;
- applying a developing solution on the photo-sensitive material and exposing the photo-sensitive material to a light source, to remove the at least one portion of the photo-sensitive material;
- etching at least one portion of the second layer that is deposited on the top surface of the at least one ridge; and
- removing the photo-sensitive material.

In another aspect, an embodiment of the present disclosure provides a semiconductor device comprising at least one patterned semiconductor wafer manufactured by a method of the aforementioned aspect, wherein a given patterned semiconductor wafer has:
- a first cladding layer;
- a second cladding layer;
- an active region disposed between a bottom surface of the first cladding layer and a top surface of the second cladding layer;
- at least one ridge protruding from a top surface of the first cladding layer, tapered portions of a first dielectric material along at least one sidewall of the at least one ridge, and a second layer of a second dielectric material on the tapered portions and on a pattern surface of the given patterned semiconductor wafer excluding a top surface of the at least one ridge;

a first electrode contacting the top surface of the at least one ridge; and a second electrode contacting a bottom surface of the given patterned semiconductor wafer;

wherein, when the semiconductor device is in operation, electrons and holes are injected into the semiconductor device, the electrons and holes recombine in the active region to emit photons from an output facet of the semiconductor device.

Embodiments of the present disclosure substantially eliminate or at least partially address the aforementioned problems in the prior art, and enable minimization of current leakages and/or optical leakages from sidewalls of ridges along with maximation of heat conduction away from semiconductor wafer, by efficiently and effectively passivating sidewalls of ridges.

Additional aspects, advantages, features and objects of the present disclosure would be made apparent from the drawings and the detailed description of the illustrative embodiments construed in conjunction with the appended claims that follow.

It will be appreciated that features of the present disclosure are susceptible to being combined in various combinations without departing from the scope of the present disclosure as defined by the appended claims.

BRIEF DESCRIPTION OF THE DRAWINGS

The summary above, as well as the following detailed description of illustrative embodiments, is better understood when read in conjunction with the appended drawings. For the purpose of illustrating the present disclosure, exemplary constructions of the disclosure are shown in the drawings. However, the present disclosure is not limited to specific methods and instrumentalities disclosed herein. Moreover, those skilled in the art will understand that the drawings are not to scale. Wherever possible, like elements have been indicated by identical numbers.

Embodiments of the present disclosure will now be described, by way of example only, with reference to the following diagrams wherein:

FIG. 3A illustrates an exemplary sidewall passivation using an existing technique;

FIG. 3B illustrates an exemplary sidewall passivation using a method for passivating sidewalls of a patterned semiconductor wafer comprising at least one ridge, in accordance with an embodiment of the present disclosure; and FIG. 4 illustrates a semiconductor device comprising at least one patterned semiconductor wafer, in accordance with an embodiment of the present disclosure.

Figure 1A:
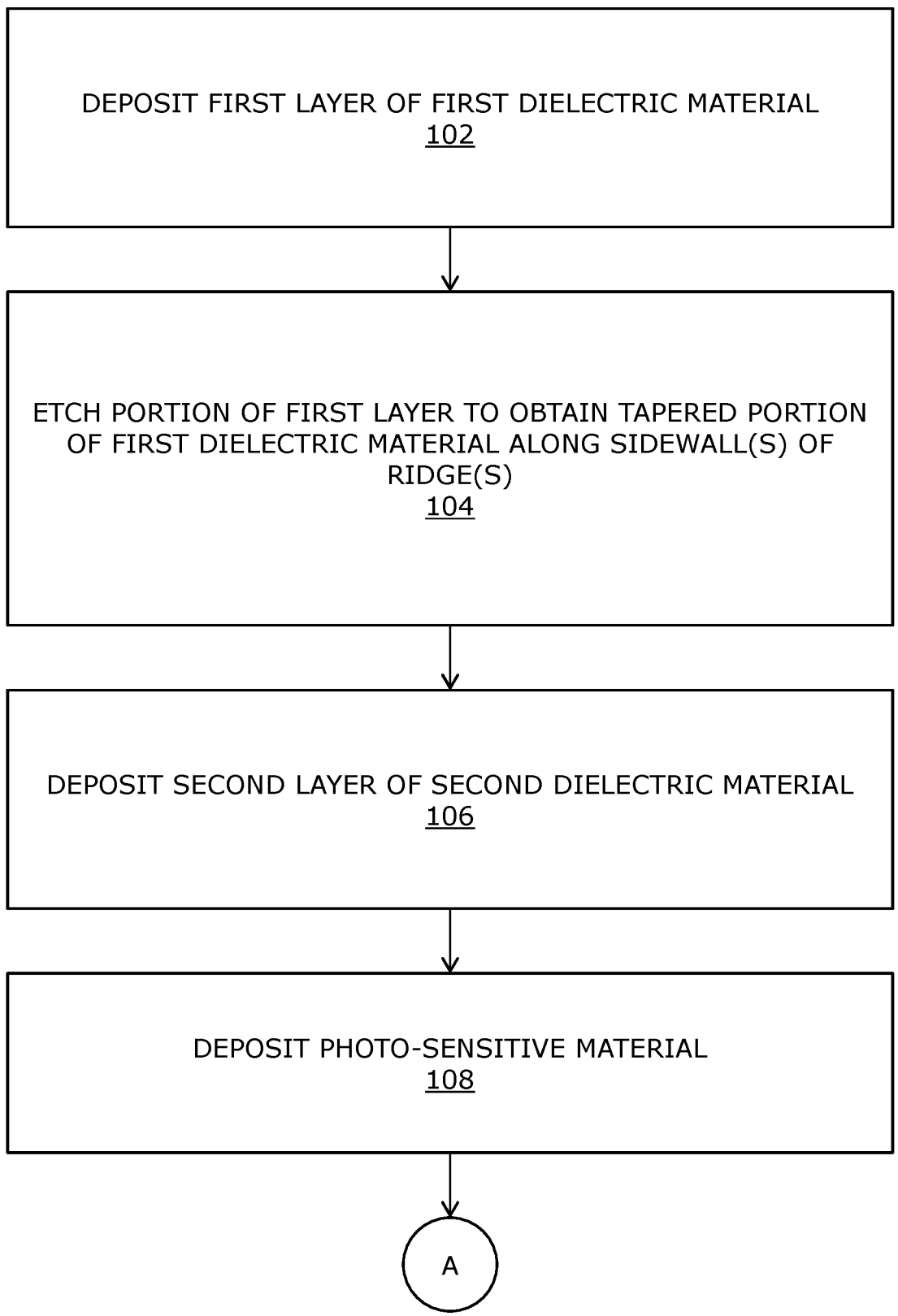
FIGS. 1A and 1B illustrate steps of a method for passivating sidewalls of a patterned semiconductor wafer comprising at least one ridge, in accordance with an embodiment of the present disclosure.

In the accompanying drawings, an underlined number is employed to represent an item over which the underlined number is positioned or an item to which the underlined number is adjacent. A non-underlined number relates to an item identified by a line linking the non-underlined number to the item. When a number is non-underlined and accompanied by an associated arrow, the non-underlined number is used to identify a general item at which the arrow is pointing.

DETAILED DESCRIPTION OF EMBODIMENTS

The following detailed description illustrates embodiments of the present disclosure and ways in which they can be implemented. Although some modes of carrying out the present disclosure have been disclosed, those skilled in the art would recognize that other embodiments for carrying out or practising the present disclosure are also possible.

In one aspect, an embodiment of the present disclosure provides a method for passivating sidewalls of a patterned semiconductor wafer comprising at least one ridge, the method comprising:

depositing a first layer of a first dielectric material on a pattern surface of the patterned semiconductor wafer;

etching a portion of the first layer to obtain tapered portions of the first dielectric material along at least one sidewall of the at least one ridge;

depositing a second layer of a second dielectric material on the tapered portions and the patterned semiconductor wafer;

depositing a photo-sensitive material on the second layer;

aligning a mask with the photo-sensitive material, wherein at least one portion of the photo-sensitive material corresponding to a top surface of the at least one ridge is unmasked, and a remaining portion of the photo-sensitive material is masked;

applying a developing solution on the photo-sensitive material and exposing the photo-sensitive material to a light source, to remove the at least one portion of the photo-sensitive material;

etching at least one portion of the second layer that is deposited on the top surface of the at least one ridge; and removing the photo-sensitive material.

In another aspect, an embodiment of the present disclosure provides a semiconductor device comprising at least one patterned semiconductor wafer manufactured by a method of the aforementioned aspect, wherein a given patterned semiconductor wafer has:

a first cladding layer;

a second cladding layer;

an active region disposed between a bottom surface of the first cladding layer and a top surface of the second cladding layer;

at least one ridge protruding from a top surface of the first cladding layer, tapered portions of a first dielectric material along at least one sidewall of the at least one ridge, and a second layer of a second dielectric material on the tapered portions and on a pattern surface of the given patterned semiconductor wafer excluding a top surface of the at least one ridge;

a first electrode contacting the top surface of the at least one ridge; and a second electrode contacting a bottom surface of the given patterned semiconductor wafer;

wherein, when the semiconductor device is in operation, electrons and holes are injected into the semiconductor device, the electrons and holes recombine in the active region to emit photons from an output facet of the semiconductor device.

The present disclosure provides the aforementioned method for passivating sidewalls of the patterned semiconductor wafer comprising the at least one ridge, and the aforementioned semiconductor device comprising the at least one patterned semiconductor wafer. Herein, the tapered portions of the first dielectric material are obtained along the sidewalls of the at least one ridge, and the second layer of the second dielectric material is obtained on the tapered portions and on the pattern surface of the patterned semiconductor wafer excluding the top surface of the at least one ridge. This provides an optimally varying thickness of passivation about the at least one ridge, for effectively addressing all requirements of the semiconductor device having such a semiconductor wafer. The method enables in efficiently insulating the sidewalls of the at least one ridge along with preventing oxidation and/or contamination of the sidewalls. Beneficially, current leakage or optical leakage through the sidewalls of the at least one ridge is minimized, and thus operational characteristics (such as resolution, accuracy, sensitivity, and the like) of the semiconductor device would be significantly improved. Moreover, the method facilitates in properly conducting heat away from the semiconductor device (by way of the second layer providing a high rate of heat transfer). This enables in effective and sufficient cooling of the semiconductor device (such as a high-power semiconductor laser), when said device is in operation. Furthermore, in the present method, the alignment of the mask is not associated with strict requirements. A high tolerance for misalignment is provided by thick sidewall passivation (by the first and second dielectric materials) that protects the at least one ridge even upon said misalignment. The method is effective, reliable and can be implemented with ease.

The method enables in efficiently passivating (i.e., protecting) the sidewalls of the patterned semiconductor wafer comprising the at least one ridge by using the first and second dielectric materials in a requisite manner to minimize problems of undesirable current leakages, optical leakages, improper heat conduction, oxidation, contamination, and the like. This is done in the method without any additional patterning step (i.e., without requiring any additional mask (such as a photoresist mask)). It will be appreciated that the patterned semiconductor wafer comprises at least one mesa structure instead of or in addition to the at least one ridge. The method also enables in efficiently passivating the sidewalls of the patterned semiconductor wafer comprising the at least one mesa structure. A "ridge" and a "mesa structure" are protrusions on the pattern surface of the patterned semiconductor wafer. Notably, the "pattern surface" refers to a top surface of the patterned semiconductor wafer.

Optionally, the method further comprises fabricating the at least one ridge on the patterned semiconductor wafer by employing at least one epitaxial process. Prior to depositing the first layer of the first dielectric material on the pattern surface of the patterned semiconductor wafer, the at least one ridge is fabricated on the patterned semiconductor wafer. The "epitaxial process" is a type of crystal growth or material deposition process wherein epitaxial layers (namely, epitaxial films) are formed on a substrate (such as the patterned semiconductor wafer). These epitaxial layers form the at least one ridge on the patterned semiconductor wafer. Optionally, the at least one epitaxial process is a homoepitaxy process, wherein a material of an epitaxial layer is same as a material of the substrate. Alternatively, optionally, the at least one epitaxial process is a heteroepitaxy process, wherein a material of an epitaxial layer is different as compared to a material of the substrate. Optionally, when fabricating the at least one ridge, a cladding layer is formed on the patterned semiconductor wafer by employing the at least one epitaxial process, and a portion of the cladding layer is etched to obtain the at least one ridge. In such a case, the at least one ridge protrudes from a top surface of the cladding layer. Optionally, a width of the at least one ridge lies in a range of 1 micrometre to 3 micrometres. As an example, the width of the at least one ridge may be from 1, 1.2, 1.4, 1.6, 1.8, 2, 2.2, 2.4 or 2.6 micrometres up to 1.4, 1.8, 2, 2.4, 2.8 or 3 micrometres. Alternatively, optionally, a width of the at least one ridge lies in a range of 1 micrometre to tens of 10 micrometres. As an example, the width of the at least one ridge may be 1 micrometre, 10 micrometres, 20 micrometres, 40 micrometres, or similar. Optionally, the at least one epitaxial process is at least one of: a metal organic chemical vapor deposition (MOCVD) process, a molecular-beam epitaxy (MBE) process.

Notably, the first layer of the first dielectric material is uniformly deposited (namely, accumulated) over an entirety of the pattern surface. The first dielectric material is deposited in all directions upon the pattern surface, without any sputtering. Optionally, in this regard, the first layer of the first dielectric material has a uniform thickness across the entirety of the pattern surface. Optionally, the thickness of the first layer lies in a range of 400 nanometres to 2000 nanometres. As an example, the thickness of the first layer may be from 400, 450, 500, 550, 600, 650, 700, 800, 900, 1000, 1100, 1200, 1300, 1400 or 1500 nanometres up to 700, 850, 1000, 1150, 1300, 1450, 1600, 1800 or 2000 nanometres. Other ranges of the thickness of the first layer are also feasible.

Optionally, the step of depositing a given layer of a given dielectric material is performed by employing a Plasma-Enhanced Chemical Vapor Deposition (PECVD) process. Notably, the given dielectric material refers to the first dielectric material, or the second dielectric material, or both. The "Plasma-Enhanced Chemical Vapor Deposition" is a chemical vapor deposition process that is used to deposit thin film(s) of a material (such as the given dielectric material) in a gaseous state as a solid state layer on a substrate (such as the patterned semiconductor wafer). The PECVD process typically utilizes an inert gas plasma for depositing the given layer of the given dielectric material. Such an inert gas plasma could be produced by a radio frequency discharge, an audio frequency discharge, a microwave frequency discharge, or similar. It will be appreciated that the PECVD process could be an Inductively Coupled Plasma-Enhanced Chemical Vapor Deposition (ICPECVD) process, an Electron Cyclotron Resonance Plasma-Enhanced Chemical Vapor Deposition (ECR-PECVD) process, or similar. The technical effect of employing the PECVD process is that the PECVD process requires a low deposition temperature, yields high-quality depositions, and has easily controllable process parameters as compared to other dielectric deposition processes. The PECVD process is well-known in the art.

Optionally, a given dielectric material is one of: silicon dioxide (SO2), silicon oxynitride (SiOxNy), silicon nitride (Si3N4). The given "dielectric material" is an electrical insulator which can be polarized when placed in an electric field. It will be appreciated that the given dielectric material provides an electrical insulation to the pattern surface by preventing undesirable leakage of current from the pattern surface, minimizes susceptibilities of the pattern surface to oxidation and/or contamination, and facilitates conduction of heat away from a semiconductor device comprising the patterned semiconductor wafer.

Notably, the portion of the first layer is chemically removed (via etching) in a manner that the tapered portions of the dielectric material are obtained along the at least one sidewall of the at least one ridge. Such tapered portions provide an electrical insulation to the at least one sidewall of the at least one ridge and protect the at least one sidewall from oxidation and/or contamination. Moreover, such tapered portions facilitate in creating a thick passivation along the at least one sidewall when the second layer is deposited on the tapered portions. The at least one sidewall could be a vertical sidewall, or an inclined (namely, tilted) sidewall. The step of etching utilizes an etchant (namely, a corrosive substance) to chemically remove the portion of the first layer. When the etchant is a gaseous-phase etchant, the step of etching is known as dry etching (namely, plasma etching), whereas when the etchant is a liquid-phase etchant, the step of etching is known as wet etching. The gaseous-phase etchant may be a plasma of highly reactive gases such as fluorocarbon, oxygen, chlorine, boron trichloride, and the like. The liquid-phase etchant may be a hydrofluoric (HF) acid, a potassium hydroxide (KOH) solution, a phosphoric acid, and the like.

Optionally, the step of etching the portion of the first layer is performed by employing a Reactive-Ion Etching (RIE) process. The "Reactive-Ion Etching" is a type of dry etching that utilizes a (chemically reactive) plasma (i.e., an ionized gas) to remove a material deposited on a substrate (such as the patterned semiconductor wafer). Such a plasma is typically generated under a low pressure (for example, a vacuum pressure) by an electromagnetic field (for example, a radio frequency electromagnetic field). Optionally, when etching the portion of the first layer by employing the RIE process, ions in the plasma are bombarded at the portion of the first layer whereat said ions chemically react with the portion of the first layer for etching the portion of the first layer. These ions carry high energy to break chemical bonds between atoms (thereby, removing/ejecting the atoms) in the portion of the first layer for etching the portion of the first layer. It will be appreciated that the RIE process facilitates in obtaining the tapered portions of the dielectric material along the at least one sidewall because the RIE process is well suitable for a directional (i.e., anisotropic) etching that is required for obtaining the tapered portions. The RIE process is well-known in the art.

Optionally, the RIE process is performed anisotropically to obtain a tapered profile of a given tapered portion, wherein a thickness of the given tapered portion is maximum at a bottom end of the at least one sidewall and reduces on going from the bottom end towards a top end of the at least one sidewall. Optionally, in this regard, when performing the RIE process anisotropically to obtain the tapered profile, an extent of etching is minimum at the bottom end to obtain the maximum thickness of the given tapered portion at the bottom end. The extent of etching increases on going from the bottom end towards the top end. The extent of etching is maximum at the top end to obtain a minimum thickness of the given tapered portion at the top end. A directional nature of the ions bombarding the portion of the first layer facilitates in anisotropic etching via the RIE process. Optionally, the RIE process is performed anisotropically by controlling a direction of bombardment of the ions towards the portion of the first layer in a manner that when the ions chemically react with the portion of the first layer along the direction of bombardment, the tapered profile of the given tapered portion is obtained.

Optionally, an extent of tapering in the tapered profile depends on an ion bombardment angle. The term "extent of tapering" refers to a degree of taper (i.e., steepness) in the tapered profile. The term "ion bombardment angle" refers to an angle at which a given ion strikes the portion of the first layer. The term "sputter yield" refers to an average number of atoms removed from the portion of the first layer per ion, when the portion of the first layer is etched. The sputter yield may also depend on an energy with which the given ion strikes the portion of the first layer, a mass of the given ion, masses of the atoms removed from said portion, and the like.

Notably, the second layer of the second dielectric material is uniformly deposited over an entirety of the tapered portions and (the pattern surface of) the patterned semiconductor wafer. The second dielectric material is deposited in all directions upon the tapered portions and (the pattern surface of) the patterned semiconductor wafer, without any sputtering. Optionally, in this regard, the second layer of the first dielectric material has a uniform thickness across the entirety of the tapered portions and (the pattern surface of) the patterned semiconductor wafer. Optionally, the thickness of the second layer lies in a range of 200 nanometres to 1000 nanometres. As an example, the thickness of the second layer may be from 200, 250, 300, 350, 400, 450, 500, 550, 600, 650 or 700 nanometres up to 400, 500, 600, 700, 800, 900 or 1000 nanometres. Other ranges of the thickness of the second layer are also feasible. An optimal thickness of the given layer may depend on the pattern surface of the patterned semiconductor wafer or any suitable process parameter. It will be appreciated that upon the depositing the second layer on the tapered portions and (the pattern surface of) the patterned semiconductor wafer, a cumulative thickness of the first and second layers (constituted by a thickness of the tapered portions of the first layer and the thickness of the second layer) is present on the at least one sidewall of the at least one ridge, whereas only a thickness of the second layer is present on the top surface of the at least one ridge.

Optionally, the first dielectric material and the second dielectric material are same. In this regard, dielectric constants of both the first dielectric material and the second dielectric material are same. In an example, the first dielectric material and the second dielectric material may be SiO2. Alternatively, optionally, the first dielectric material and the second dielectric material are different. In this regard, dielectric constants of the first dielectric material and the second dielectric material are different. In an example, the first dielectric material may be SiO2 and the second dielectric material may be Si3N4.

Optionally, a thickness of the second layer is lesser than a thickness of the first layer. In such a case, the second layer facilitates in properly conducting the heat away from the semiconductor device comprising the patterned semiconductor wafer. In other words, the second layer provides a high rate of heat transfer. This enables in providing effective and sufficient cooling of the semiconductor device (such as a high-power semiconductor laser), when said device is in operation, as such a device is typically mounted p-side down to sub-mount. Simultaneously, the cumulative thickness of the first and second layers present on the at least one sidewall of the at least one ridge facilitates in suitably insulating the at least one sidewall. This enables in minimizing problems of current leakage, optical leakage, and the like, from the at least one sidewall. In an example, the thickness of the first layer may be 600 nanometres (or 0.6 micrometres), and the thickness of the second layer may be 300 nanometres (or 0.3 micrometres). The cumulative thickness could also protect the at least one ridge in later processing steps (such as further etching processes). The method could enable in compensating deposition thickness difference in a horizontal orientation with respect to a vertical orientation, as a deposited thickness of the given layer is less in the horizontal orientation as compared to a deposited thickness of the given layer in the vertical orientation.

Upon depositing the second layer on the tapered portions and the patterned semiconductor wafer, the photo-sensitive material is deposited on the second layer. Optionally, the photo-sensitive material is a photoresist. In an example, the photoresist is a diazonaphthoquinone (DNQ)-Novolac photoresist. Optionally, the step of depositing the photo-sensitive material is performed by employing a spin coating process. The "spin coating process" is used to deposit a thin film of a coating material (such as the photo-sensitive material) uniformly onto a substrate (i.e., the patterned semiconductor wafer). Typically, a small amount of the photo-sensitive material is applied on a centre of the patterned semiconductor wafer, and then the patterned semiconductor wafer is rotated (namely, spun) at a high angular speed (such as at 10000 rotations per minute) in order to spread the photo-sensitive material uniformly onto the patterned semiconductor wafer, by virtue of a centrifugal force. Higher the angular speed of spinning, thinner is the film of the photo-sensitive material. The technical effect of employing the spin coating process is that the spin coating process produces high-quality thin depositions of the photo-sensitive material, and is cost-effective as compared to other photo-sensitive material deposition processes. The spin coating process is well-known in the art.

The "mask" is an element which is patterned to have opaque regions and holes (or transparencies), as required. Optionally, when aligning the mask with the photo-sensitive material, the mask and the patterned semiconductor wafer are moved towards each other until there is a predefined gap between the mask and the photo-sensitive material, and the patterned semiconductor wafer is then moved relative to the mask until the mask is aligned with the photo-sensitive material. Since the top surface of the at least one ridge is to be utilized for driving a current through the patterned semiconductor wafer, the top surface of the at least one ridge needs to be uninsulated (or uncovered) by any dielectric material. Therefore, the at least one portion of the photo-sensitive material corresponding to the top surface of the at least one ridge is unmasked (via a hole in the mask). Moreover, since an insulation is required on the pattern surface of the given patterned semiconductor wafer excluding the top surface of the at least one ridge, the remaining portion of the photo-sensitive material is masked. Optionally, the predefined gap lies in the range of 0 micrometre narrower than the width of the at least one ridge to 10 micrometres narrower than the width of the at least one ridge. As an example, when the width of the at least one ridge is 1 micrometre, the predefined gap may be 1 micrometre. In another example, when the width of the at least one ridge is 20 micrometres, the predefined gap may be 10 micrometres.

Optionally, the light source activates the developing solution applied on the photo-sensitive material. The light source (such as an ultra-violet (UV) light source) produces actinic rays that initiates a photochemical reaction. Owing to this, the at least one portion (i.e., an unmasked portion) of the photo-sensitive material is removed by the developing solution. The remaining portion (i.e., a masked portion) of the photo-sensitive material, remains unaffected by the developing solution. Examples of the developing solution may include, but are not limited to, sodium hydroxide (NaOH), potassium hydroxide (KOH), tetraethanol ammonium hydroxide (C8H21NO5). It will be appreciated that the steps of aligning the mask, applying the developing solution on the photo-sensitive material, and exposing the photo-sensitive material to the light source are well-known in the art, and could be performed according to recommendation(s) of a fabricator of the photo-sensitive material.

Upon removing the at least one portion of the photo-sensitive material, the at least one portion of the second layer that is deposited on the top surface of the at least one ridge is etched so that the top surface of the at least one ridge would be uninsulated (or uncovered) by any dielectric material. This enables the top surface of the at least one ridge to be utilized for driving the current through the patterned semiconductor wafer. Optionally, the step of etching the at least one portion of the second layer is performed by employing the RIE process. Any other suitable etching process other than the RIE process could also be employed. It will be appreciated that when a chemical etching (namely, wet etching) and a physical etching (i.e., in the RIE process) are used, a balance between the chemical etching and the physical etching is optimal so that the given dielectric material does not remove from the at least one ridge.

Next, since the photo-sensitive material on the second layer is no longer needed, the photo-sensitive material is removed. Optionally, the step of removing the photo-sensitive material is performed by employing one of: the RIE process, a photoresist stripping process, a plasma etching process. Upon removal of the photo-sensitive material, the patterned semiconductor wafer has tapered portions of the first dielectric material along the at least one sidewall of the at least one ridge, and the second layer of the second dielectric material on the tapered portions and on the pattern surface of the patterned semiconductor wafer excluding the top surface of the at least one ridge.

Optionally, the method further comprises depositing a metallic layer on a pattern surface of the patterned semiconductor wafer to form a first electrode, using a metallization process. The "metallizing process" is a technique of depositing the metallic layer (i.e., a layer of a metal) on a surface of a substrate (such as, on the pattern surface of the patterned semiconductor wafer). It will be appreciated that the first electrode contacts the top surface of the at least one ridge and is utilized for driving the current through the patterned semiconductor wafer. The metallization process is performed after removing the photo-sensitive material. Examples of the metal (of the metallic layer) may include, but are not limited to aluminium, nickel, gold, copper, silver, tungsten. Optionally, the metallization process is one of: a Physical Vapor Deposition (PVD) process utilizing sputtering, a filament evaporation process, an Electron-beam (E-beam) evaporation process. The metallization process is well-known in the art. It will be appreciated that a gradual tapered profile of the first layer and deposition of the second layer thereon facilitates in easing the metallization process by offering a better shape for continuity of the metallic layer and planarization.

The present disclosure also relates to the semiconductor device as described above. Various embodiments and variants disclosed above, with respect to the aforementioned method, apply mutatis mutandis to the semiconductor device. In some implementations, the semiconductor device comprises a single patterned semiconductor wafer. In some implementations, the semiconductor device comprises a plurality of patterned semiconductor wafers. It will be appreciated that the semiconductor device may be used in biomedical applications, security applications, extended-reality reality applications, and the like. Examples of the semiconductor device may include, but are not limited to, a Vertical Cavity Surface-Emitting Laser (VCSEL), a photodiode, a Light-Emitting Diode (LED). The photodiode could be an avalanche photodiode (APD). The LED could be a Micro-Cavity Light-Emitting Diode (MCLED). A given "cladding layer" is a layer of a semiconductor material that is deposited (namely, grown) at least on the pattern surface of the given patterned semiconductor wafer. As an example, the semiconductor material of the given cladding layer may be aluminium gallium arsenide (AlGaAs). Optionally, the given cladding layer is deposited by employing the at least one epitaxial process. It will be appreciated that the first cladding layer, the second cladding layer and the active region collectively form a double heterostructure, wherein the second cladding layer is deposited on the pattern surface, the active region is disposed on the top surface of the second cladding layer, and the first cladding layer is deposited on top of the active region. The active region may be understood to be sandwiched between the bottom surface of the first cladding layer and the top surface of the second cladding layer. As an example, a material of the active region may be gallium arsenide (GaAs). Optionally, when the semiconductor device is in operation, the first electrode is an anode and the second electrode is a cathode.

Optionally, the top surface of the at least one ridge is planar. Moreover, optionally, the at least one sidewall of the at least one ridge is planar. Optionally, a height of the at least one ridge protruding from the top surface of the first cladding layer lies in a range of 500 nanometres to 4000 nanometres. As an example, the height of the at least one ridge may be from 500, 550, 600, 650, 700, 800, 900, 1000, 1200, 1400, 1600, 1800, 2000, 2300, 2600, 2900, 3200 or 3500 nanometres up to 1000, 1250, 1500, 1750, 2000, 2350, 2700, 3050, 3400, 3750 or 4000 nanometres. Other ranges of the height of the at least one ridge are also feasible.

Optionally, the output facet of the semiconductor device lies on a side surface of the semiconductor device. Optionally, an area of the output facet lies in the range of 2E4 square micrometres to 6E4 square micrometres. Optionally, an optical coupler is arranged at the output facet for effectively coupling the emitted photons to a light guide. The optical coupler is a device that provides a leak proof connection between the output facet of the semiconductor device and the light guide. The light guide may be an optical fibre cable, an optical waveguide, and the like.

Optionally, the first cladding layer is of a first conductivity type and the second cladding layer is of a second conductivity type, and wherein the first electrode and the second electrode are connected to a positive terminal and a negative terminal of a power source, respectively, for the semiconductor device to be in operation. Optionally, when the first cladding layer is of p-type conductivity, and the second cladding layer is of n-type conductivity, and when the first and second electrodes are connected to the positive and negative terminals, respectively, the semiconductor device is said to operate in a forward bias state. In such a case, the first cladding layer, the second cladding layer, and the active region disposed between them form a forward biased PN junction. When the semiconductor device is in operation, a current flows through the semiconductor device, and the electrons are injected from the second cladding layer into the active region while the holes are injected from the first cladding layer into the active region. When the electrons and holes interact in the active region, the electrons and holes recombine as the electrons drops into the holes to release the photons. These photons are confined within the active region as refractive indices of the first and second cladding layers are lower than that of the active region. The photons reciprocate in the active region, and are amplified by stimulated emission process and finally the photons are emitted from the output facet as a light beam.

Optionally, the semiconductor device is a Ridge Waveguide (RWG) laser device. The "Ridge Waveguide laser device" a type of laser device that uses a waveguide structure as a gain medium (namely, a source of an optical gain within the RWG laser device) to produce a light beam (i.e., a laser beam). The "optical gain" is an ability of the laser device to deliver a given energy of light per unit time. When the laser beam (produced by the RWG laser device) propagates in a homogeneous medium, the waveguide structure having a spatially-varying refractive index profile beneficially prevents an expansion (i.e., spreading) of the laser beam. This is especially useful in high-precision applications of the semiconductor device. These high-precision applications could be biomedical applications, security applications, and the like. The RWG laser device could operate on a single resonant mode, thereby producing a laser beam of a single frequency and a single wavelength, or could operate on a multi-resonant mode, thereby producing a laser beam of multiple frequencies and multiple wavelengths.

Optionally, the RWG laser device is a gain-guided laser device. In the gain-guided laser device, the optical gain is controlled by restricting a flow of the current to a narrow portion of the active region. This could be achieved by insulating peripheral sides in the active region with an insulating material, in a manner that the current is blocked from flowing through any of the peripheral sides. The only path for the current would be through the narrow portion at a middle of the active region. In such a case, recombination of the electrons and holes would only occur in the narrow portion of the active region, thus only the narrow portion has the optical gain. Therefore, in the laser beam emitted from the output facet, a central region of the laser beam is more amplified as compared to a peripheral region of the laser beam, and a width of the laser beam is also narrow. Alternatively, optionally, the RWG laser device is an index-guided laser device. It will be appreciated that gain properties could be enhanced by using index-guiding in which an optical field of the photons is confined by placing stripes of a semiconductor material of a low refractive index beside the active region in the RWG laser device. In such a case, the active region has a narrow portion, and total internal reflection confines photon emission in the narrow portion. Such index-guiding serves to guide and confine the photons in the active region of the index-guided laser device better than the gain guidance alone, in order to produce a better quality (for example, a high directionality) of the laser beam.

Experimental Part

An experimental comparison between the method of the present disclosure and existing techniques for passivating sidewalls of ridges/mesas of semiconductor wafer was performed. Separate samples of a semiconductor wafer having a ridge were taken and subjected to the method of the present disclosure and the existing techniques. A scanning electron microscope (SEM) was used to produce SEM images of the samples upon passivation of the sidewalls of the ridge by these two approaches.

Based on the SEM images, it was observed that the method of the present disclosure provides better sidewall passivation and protection of the ridge as compared to the existing techniques. It was experimentally observed that thick sidewall passivation obtained using the method described herein eases strict mask alignment requirements as compared to the existing techniques. The thick sidewall passivation successfully protects the ridge even when an additional portion of the second layer (i.e., a portion of the second layer other than the at least one portion deposited on a top surface of the ridge) is etched away due to slight mask misalignment. Furthermore, a profile of the first and second dielectric materials formed about the ridge using the method described herein eased the metallization process and provided a better shape and continuity of the metal as compared to the existing techniques. A detailed description of the observations of these experiments is provided hereinbelow in conjunction with FIGS. 3A and 3B.

DETAILED DESCRIPTION OF THE DRAWINGS

Figure 1B:
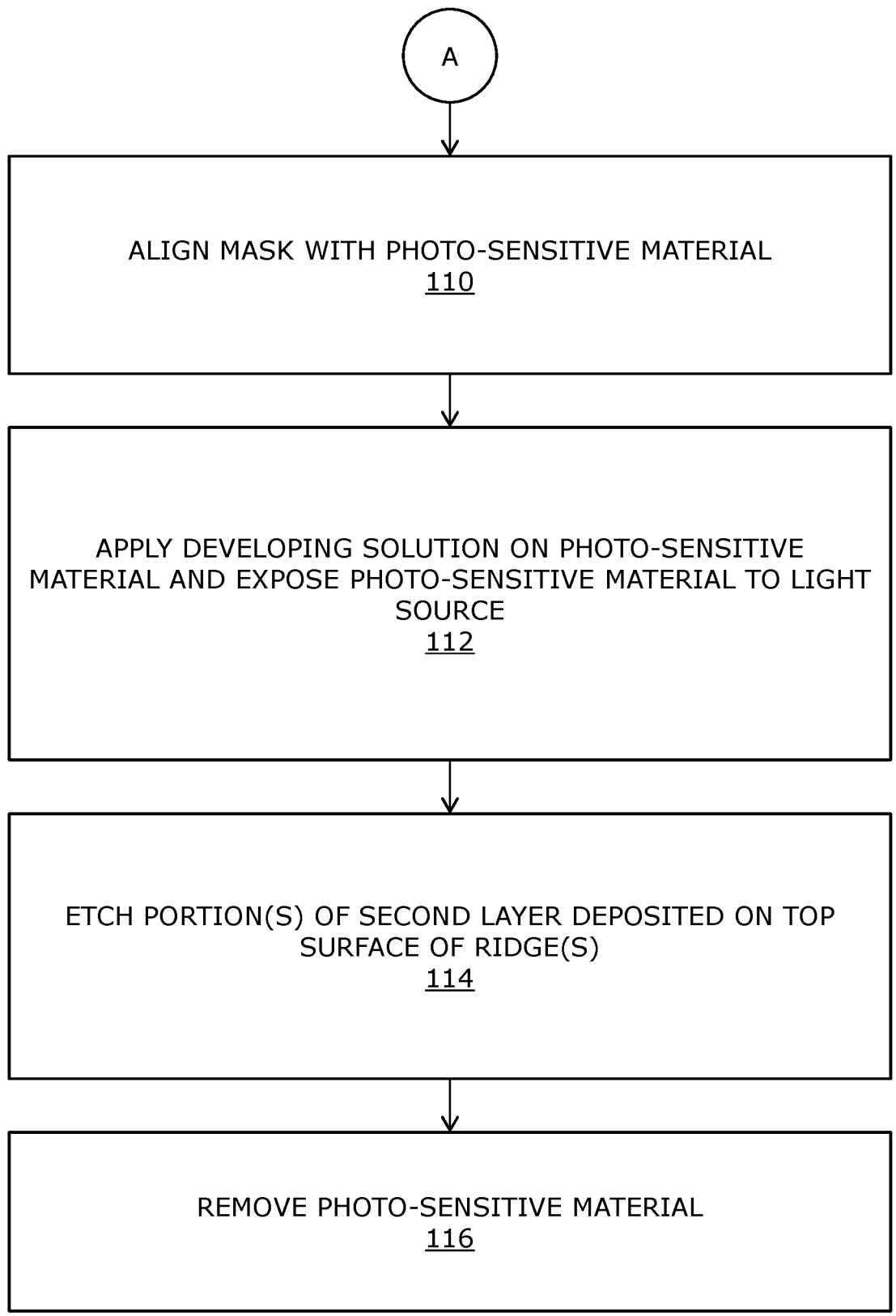

Referring to FIGS. 1A and 1B, illustrated are steps of a method for passivating sidewalls of a patterned semiconductor wafer comprising at least one ridge, in accordance with an embodiment of the present disclosure. At step 102, a first layer of a first dielectric material is deposited on a pattern surface of the patterned semiconductor wafer. At step 104, a portion of the first layer is etched to obtain tapered portions of the first dielectric material along at least one sidewall of the at least one ridge. At step 106, a second layer of a second dielectric material is deposited on the tapered portions and the patterned semiconductor wafer. At step 108, a photo-sensitive material is deposited on the second layer. At step 110, a mask is aligned with the photo-sensitive material, wherein at least one portion of the photo-sensitive material corresponding to a top surface of the at least one ridge is unmasked, and a remaining portion of the photo-sensitive material is masked. At step 112, a developing solution is applied on the photo-sensitive material and the photo-sensitive material is exposed to a light source, to remove the at least one portion of the photo-sensitive material. At step 114, at least one portion of the second layer that is deposited on the top surface of the at least one ridge is etched. At step 116, the photo-sensitive material is removed.

The steps 102, 104, 106, 108, 110, 112, 114, and 116 are only illustrative and other alternatives can also be provided where one or more steps are added, one or more steps are removed, or one or more steps are provided in a different sequence without departing from the scope of the claims herein.

Figure 2A:
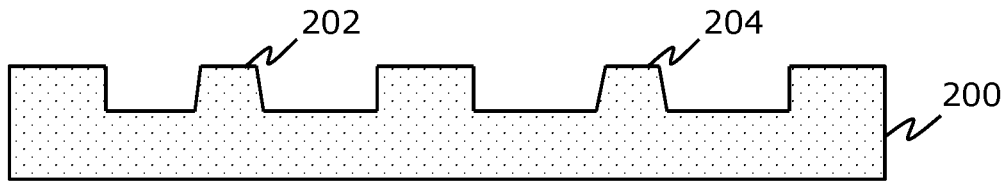
FIGS. 2A, 2B, 2C, 2D, 2E, 2F, 2G, 2H, and 2I collectively illustrate a process flow for passivating sidewalls of a patterned semiconductor wafer comprising at least one ridge, in accordance with an embodiment of the present disclosure.
Figure 2B:
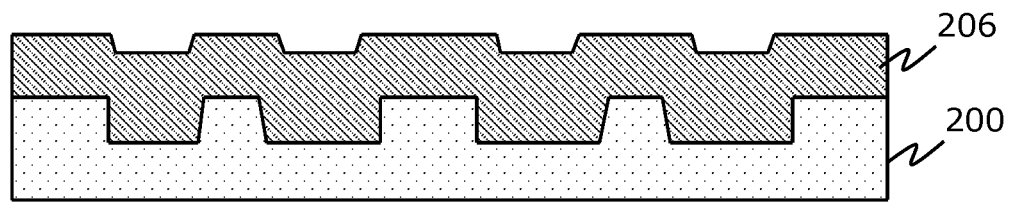
Figure 2C:
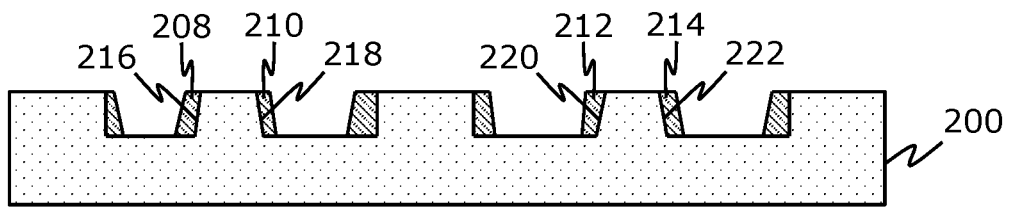
Figure 2D:
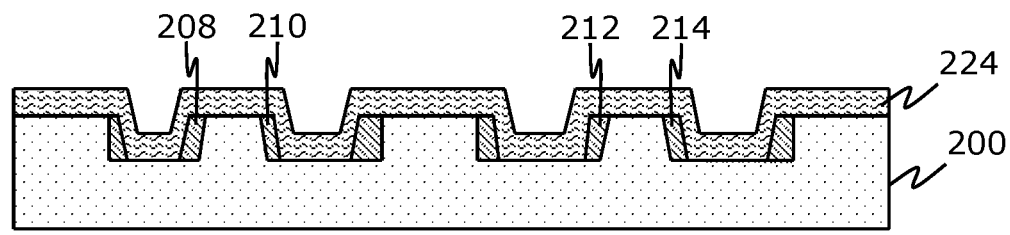
Figure 2E:
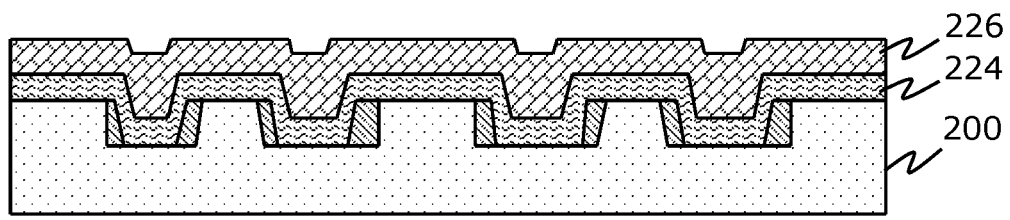
Figure 2F:
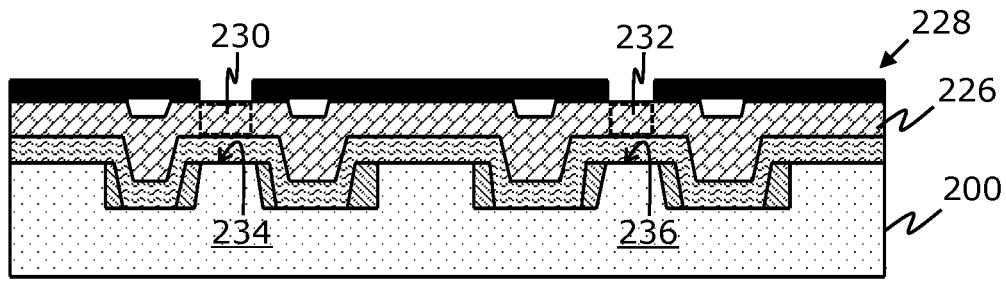
Figure 2G:
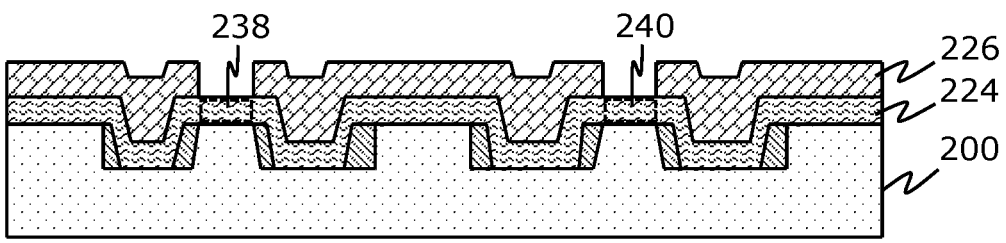
Figure 2H:
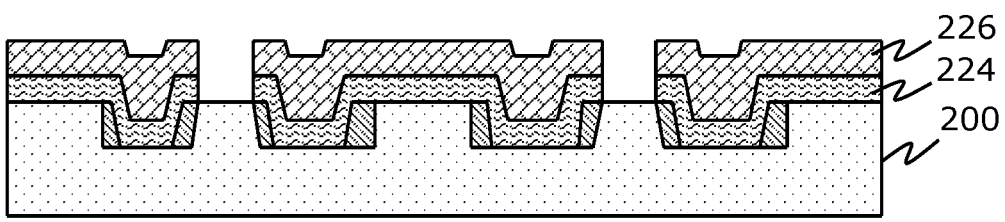
Figure 2I:
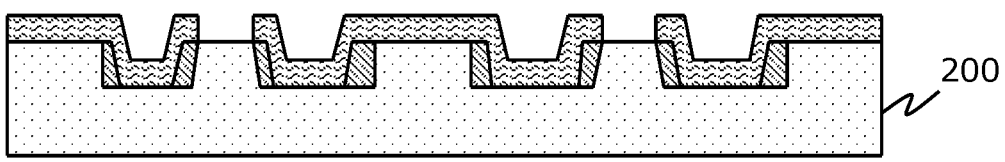

Referring to FIGS. 2A, 2B, 2C, 2D, 2E, 2F, 2G, 2H, and 2I, the FIGS. 2A-2I collectively illustrate a process flow for passivating sidewalls of a patterned semiconductor wafer 200 (depicted by a dotted pattern) comprising at least one ridge (depicted as a plurality of ridges 202 and 204), in accordance with an embodiment of the present disclosure. Notably, the process flow illustrated in the FIGS. 2A-2I corresponds to steps 102 to 116 of the method illustrated in FIGS. 1A and 1B. For sake of simplicity, in the FIGS. 2A-2I, a cross-sectional view of the patterned semiconductor wafer 200 comprising the ridges 202 and 204 is shown, and in the FIGS. 2B-2I, the ridges 202 and 204 are not numbered. In FIG. 2B, there is shown a first layer 206 (depicted by a diagonal stripe pattern) of a first dielectric material deposited on a pattern surface of the patterned semiconductor wafer 200. The first layer 206 is deposited by employing, for example, a Plasma-Enhanced Chemical Vapor Deposition (PECVD) process (not shown). In FIG. 2C, there are shown tapered portions (for example, depicted as tapered portions 208, 210, 212, and 214) of the first dielectric material along at least one sidewall (depicted as sidewalls 216 and 218 of the ridge 202, and sidewalls 220 and 222 of the ridge 204). The tapered portions 208, 210, 212, and 214 are obtained by etching (namely, removing) a portion of the first layer 206 (as shown in FIG. 2B). Said etching may be performed by employing, for example, a Reactive-Ion Etching (RIE) process (not shown). In FIG. 2D, there is shown a second layer 224 (depicted by a wavy pattern) of a second dielectric material deposited on the tapered portions 208, 210, 212, and 214 and the patterned semiconductor wafer 200. The second layer 224 is deposited by employing, for example, the PECVD process. In FIG. 2E, there is shown a photo-sensitive material 226 (depicted by a diagonal brick pattern) deposited on the second layer 224. The photo-sensitive material 226 is deposited by employing, for example, a spin coating process (not shown). In FIG. 2F, there is shown a mask 228 aligned with the photo-sensitive material 226 in a manner that at least one portion (depicted as portions 230 and 232 enclosed in dotted rectangles) of the photo-sensitive material 226 corresponding to a top surface 234 of the ridge 202 and a top surface 236 of the ridge 204 is unmasked, and a remaining portion of the photo-sensitive material 226 is masked. In FIG. 2G, when a developing solution (not shown) is applied on the photo-sensitive material 226 and the photo-sensitive material 226 is exposed to a light source (not shown), the portions 230 and 232 (as shown in FIG. 2F) of the photo-sensitive material 216 are removed. In FIG. 2H, at least one portion (depicted as portions 238 and 240 enclosed in dotted rectangles in FIG. 2G) of the second layer 224 that is deposited on the top surfaces 234 and 236 (as shown in FIG. 2F) is etched. In FIG. 2I, the photo-sensitive material 226 is removed, and passivated sidewalls of the patterned semiconductor wafer 200 are obtained as shown.

It may be understood by a person skilled in the art that the FIGS. 2A-2I are merely examples for sake of clarity, which should not unduly limit the scope of the claims herein. The person skilled in the art will recognize many variations, alternatives, and modifications of embodiments of the present disclosure.

Referring to FIG. 3A, illustrated is an exemplary sidewall passivation using an existing technique. Herein, sidewalls 302 and 304 of a ridge 306 (of a sample of a semiconductor wafer 308) are passivated (namely, protected) by a single layer 310 of a dielectric material. This results in inefficient sidewall passivation as the single layer 310 is unable to requisitely prevent undesirable leakage of current from the sidewalls 302 and 304, is unable to minimize susceptibilities of the sidewalls 302 and 304 to oxidation and/or contamination, and is unable to improve conduction of heat away from the semiconductor wafer 308. Moreover, due to strict tolerances in the existing technique and a poor alignment of a photoresist mask, sharp and/or non-uniform edges of the dielectric material tend to form near the ridge 306, thereby complicating metallization (i.e., depositing a metallic layer 312 (depicted as a dotted pattern)) on the semiconductor wafer 308 as shown.

Referring to FIG. 3B, illustrated is an exemplary sidewall passivation using a method for passivating sidewalls 314 and 316 of a sample of a patterned semiconductor wafer 318 comprising one ridge (depicted as a ridge 320), in accordance with an embodiment of the present disclosure. Herein, the sidewalls 314 and 316 of the ridge 320 are passivated by tapered portions 322 and 324 of a first dielectric material and a second dielectric material, and additionally by a second layer 326 of the second dielectric material deposited adjacent to the tapered portions 322 and 324. This results in an optimum (i.e., requisite) sidewall passivation which prevents undesirable leakage of current from the sidewalls 314 and 316, minimizes susceptibilities of the sidewalls 314 and 316 to oxidation and/or contamination, and significantly improves conduction of heat away from the patterned semiconductor wafer 318. Moreover, a gradual profile of the tapered portions 322 and 324 and deposition of the second layer 326 thereon facilitates in metallization (i.e., depositing a metallic layer 328 (depicted as a diagonal stripe pattern)) on a pattern surface of the patterned semiconductor wafer 318 with ease. It is observed that the sidewall passivation using the method provides better protection of the ridge 320 as compared to the sidewall passivation of FIG. 3A. A thick sidewall passivation obtained using the method eases strict mask alignment requirements. The thick sidewall passivation successfully protects the ridge 320 even when an additional portion (not shown) of the second layer 326 is etched away due to slight mask misalignment.

It may be understood by a person skilled in the art that the FIGS. 3A and 3B are merely examples for sake of clarity, which should not unduly limit the scope of the claims herein. The person skilled in the art will recognize many variations, alternatives, and modifications of embodiments of the present disclosure.

Referring to FIG. 4, illustrated is a semiconductor device 400 comprising at least one patterned semiconductor wafer (depicted as a patterned semiconductor wafer 402), in accordance with an embodiment of the present disclosure. The patterned semiconductor wafer 402 has a first cladding layer 404, a second cladding layer 406, an active region 408, at least one ridge (depicted as a ridge 410), a first electrode 412, and a second electrode 414. The active region 408 is disposed between a bottom surface (not shown) of the first cladding layer 404 and a top surface (not shown) of the second cladding layer 406. The ridge 410 protrudes from a top surface 416 of the first cladding layer 404. The patterned semiconductor wafer 402 has tapered portions (not shown) of a first dielectric material along at least one sidewall (not shown) of the ridge 410, and has a second layer (not shown) of a second dielectric material on the tapered portions and on a pattern surface of the patterned semiconductor wafer 402 excluding a top surface 418 of the ridge 410. The first electrode 412 contacts the top surface 418 of the ridge 410, while the second electrode 414 contacts a bottom surface (not shown) of the patterned semiconductor wafer 402. When the semiconductor device 400 is in operation, electrons (not shown) and holes (not shown) are injected into the semiconductor device 400, the electrons and holes recombine in the active region 408 to emit photons from an output facet 420 of the semiconductor device 400.

It may be understood by a person skilled in the art that the FIG. 4 is a simplified illustration of the semiconductor device 400 for sake of clarity, which should not unduly limit the scope of the claims herein. The person skilled in the art will recognize many variations, alternatives, and modifications of embodiments of the present disclosure.

Modifications to embodiments of the present disclosure described in the foregoing are possible without departing from the scope of the present disclosure as defined by the accompanying claims. Expressions such as "including", "comprising", "incorporating", "have", "is" used to describe and claim the present disclosure are intended to be construed in a non-exclusive manner, namely allowing for items, components or elements not explicitly described also to be present. Reference to the singular is also to be construed to relate to the plural.

What is claimed is:

1. A method for passivating sidewalls of a patterned semiconductor wafer comprising at least one ridge, the method comprising:

depositing a first layer of a first dielectric material on a pattern surface of the patterned semiconductor wafer;

etching a portion of the first layer to remove the first layer from a top surface of the at least one ridge and obtain tapered portions of the first dielectric material along at least one sidewall of the at least one ridge;

depositing a second layer of a second dielectric material on the tapered portions and the patterned semiconductor wafer, wherein the top surface of the at least one ridge is covered only by the second layer;

depositing a photo-sensitive material on the second layer;

aligning a mask with the photo-sensitive material, wherein at least one portion of the photo-sensitive material corresponding to a top surface of the at least one ridge is unmasked, and a remaining portion of the photo-sensitive material is masked;

applying a developing solution on the photo-sensitive material and exposing the photo-sensitive material to a light source, to remove the at least one portion of the photo-sensitive material and leave only the second layer covering the top surface of the at least one ridge;

etching at least one portion of the second layer that is covering the top surface of the at least one ridge to expose at least one portion of the top surface of the at least one ridge; and removing the photo-sensitive material, wherein the passivated sidewalls comprise the first layer covered by the second layer, wherein a thickness of the first layer is in a range of 400 to 2000 nanometers and a thickness of the second layer is in a range of 200-1000 nanometers.

2. The method according to claim 1, wherein the step of etching the portion of the first layer is performed by employing a Reactive-Ion Etching (RIE) process.

3. The method according to claim 2, wherein the RIE process is performed anisotropically to obtain a tapered profile of a given tapered portion, wherein a thickness of the given tapered portion is maximum at a bottom end of the at least one sidewall and reduces on going from the bottom end towards a top end of the at least one sidewall.

4. The method according to claim 3, wherein an extent of tapering in the tapered profile depends on an ion bombardment angle.

5. The method according to claim 1, wherein the thickness of the second layer is lesser than the thickness of the first layer.

6. The method according to claim 1, further comprising depositing a metallic layer on a pattern surface of the patterned semiconductor wafer to form a first electrode, using a metallization process.

7. The method according to claim 1, further comprising fabricating the at least one ridge on the patterned semiconductor wafer by employing at least one epitaxial process.

8. The method according to claim 1, wherein the step of depositing the first layer of the first dielectric material or the step of depositing the second layer of the second dielectric material is performed by employing a Plasma-Enhanced Chemical Vapor Deposition (PECVD) process.

9. The method according to claim 1, wherein the step of depositing the photo-sensitive material is performed by employing a spin coating process.

10. The method according to claim 1, wherein the first layer of the first dielectric material or the second layer of the second dielectric material is one of: silicon dioxide ($SO_2$), silicon oxynitride ($SiO_xN_y$), silicon nitride ($Si_3N_4$).

11. The method according to claim 1, wherein the thickness of the first layer is in the range of 500 nanometers to 1200 nanometers and the thickness of the second layer is in the range of 200-nanometers to 600 nanometers.

* * * * *